United States Patent
Lin et al.

(10) Patent No.: US 8,970,297 B2
(45) Date of Patent: Mar. 3, 2015

(54) RECONFIGURABLE INPUT POWER DISTRIBUTION DOHERTY AMPLIFIER WITH IMPROVED EFFICIENCY

(75) Inventors: Saihua Lin, Sunnyvale, CA (US); Roger Brockenbrough, Los Gatos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 74 days.

(21) Appl. No.: 13/424,199

(22) Filed: Mar. 19, 2012

(65) Prior Publication Data

US 2013/0241640 A1 Sep. 19, 2013

(51) Int. Cl.
*H03F 3/68* (2006.01)
*H03F 3/60* (2006.01)

(52) U.S. Cl.
CPC ...................................... *H03F 3/602* (2013.01)
USPC ....................................... 330/124 R

(58) Field of Classification Search
USPC .................. 330/53, 84, 107, 109, 124 R, 295
See application file for complete search history.

(56) References Cited

U.S. PATENT DOCUMENTS

| | | | | |
|---|---|---|---|---|
| 4,490,684 A * | 12/1984 | Epsom et al. | ............. | 330/124 R |
| 5,287,069 A * | 2/1994 | Okubo et al. | ............. | 330/124 R |
| 6,384,679 B1 | 5/2002 | Lorenz | | |
| 6,700,440 B2 | 3/2004 | Hareyama | | |
| 6,750,707 B2 * | 6/2004 | Takei et al. | ............... | 330/124 R |
| 6,794,935 B2 | 9/2004 | Klomsdorf et al. | | |
| 6,853,245 B2 | 2/2005 | Kim et al. | | |
| 7,157,965 B1 | 1/2007 | Kim | | |
| 7,183,843 B1 * | 2/2007 | Jones et al. | ............... | 330/124 R |
| 7,202,736 B1 | 4/2007 | Dow et al. | | |
| 7,262,656 B2 | 8/2007 | Shiikuma | | |
| 7,295,064 B2 | 11/2007 | Shiikuma et al. | | |
| 7,295,065 B2 | 11/2007 | Shah et al. | | |
| 7,609,115 B2 | 10/2009 | Whelan et al. | | |
| 7,609,116 B2 | 10/2009 | Gerhard et al. | | |
| 7,646,248 B2 | 1/2010 | Yang et al. | | |
| 7,663,435 B2 | 2/2010 | Kim et al. | | |
| 7,863,976 B1 | 1/2011 | Loeb et al. | | |
| 7,884,668 B2 | 2/2011 | Blednov | | |
| 8,103,221 B2 | 1/2012 | Ta et al. | | |

(Continued)

FOREIGN PATENT DOCUMENTS

| | | |
|---|---|---|
| EP | 2234271 A2 | 9/2010 |
| JP | 2009303040 A | 12/2009 |

(Continued)

OTHER PUBLICATIONS

Kim et al., "Optimum operation of asymmetrical-cells-based linear Doherty power Amplifiers-uneven power drive and power matching," IEEE Transactions on Microwave Theory and Techniques, vol. 53, Issue 5, May 2005, 8 pages.

(Continued)

*Primary Examiner* — Khanh V Nguyen
(74) *Attorney, Agent, or Firm* — Ramin Mobarhan

(57) ABSTRACT

A novel Doherty amplifier with improved efficiency is disclosed. In an exemplary embodiment an apparatus includes a phase shifter configured to generate a phase shifted first millimeter (MM) wave signal based on a selected phase shift, and a hybrid plus coupler comprising output terminals and configured to adjust output power levels at the output terminals based on combinations of the phase shifted first MM wave signal and a second MM wave signal.

18 Claims, 4 Drawing Sheets

(56) References Cited

U.S. PATENT DOCUMENTS

| | | |
|---|---|---|
| 8,245,179 B2 | 8/2012 | Inoue |
| 8,374,279 B2 * | 2/2013 | Adler et al. .................. 375/295 |
| 2003/0025555 A1 | 2/2003 | Ohnishi et al. |
| 2003/0076167 A1 | 4/2003 | Hellberg |
| 2003/0090287 A1 | 5/2003 | Zivanovic |
| 2005/0030107 A1 | 2/2005 | Shimizu et al. |
| 2005/0134377 A1 | 6/2005 | Dent |
| 2006/0057981 A1 | 3/2006 | Tsuda |
| 2006/0105733 A1 | 5/2006 | Singh et al. |
| 2007/0149146 A1 | 6/2007 | Hwang et al. |
| 2008/0117894 A1 | 5/2008 | McMorrow |
| 2008/0132180 A1 | 6/2008 | Manicone et al. |
| 2008/0207256 A1 | 8/2008 | Chan |
| 2009/0190509 A1 | 7/2009 | Yoon |
| 2010/0001802 A1 | 1/2010 | Blednov |
| 2010/0127780 A1 | 5/2010 | An et al. |
| 2010/0188146 A1 | 7/2010 | Chung et al. |
| 2010/0188147 A1 | 7/2010 | Blednov et al. |
| 2010/0225400 A1 | 9/2010 | Rofougaran et al. |
| 2010/0295629 A1 | 11/2010 | Klemens et al. |
| 2011/0026442 A1 | 2/2011 | Yoon |
| 2011/0032854 A1 | 2/2011 | Carney et al. |
| 2011/0122932 A1 | 5/2011 | Lovberg et al. |
| 2011/0140786 A1 | 6/2011 | Blednov |
| 2011/0169590 A1 | 7/2011 | Namerikawa et al. |
| 2011/0279184 A1 | 11/2011 | Chan et al. |
| 2012/0062334 A1 | 3/2012 | Yehezkely |
| 2012/0105147 A1 | 5/2012 | Harris et al. |
| 2012/0184233 A1 | 7/2012 | Jones et al. |
| 2012/0286875 A1 | 11/2012 | Chan |
| 2014/0170995 A1 | 6/2014 | Lin |

FOREIGN PATENT DOCUMENTS

| | | |
|---|---|---|
| WO | 2006066461 A1 | 6/2006 |
| WO | 2011045312 A1 | 4/2011 |

OTHER PUBLICATIONS

Adabi, "A mm-Wave transformer based TR switch in 90nm CMOS technology", Proceedings of the 39th European Microwave Conference, Sep. 2009, 4 pgs.

Cohen, et al., "A bidirectional TX/RX four element phased-array at 60GHz with RF-IF conversion block in 90nm CMOS process", 2009 IEEE Radio Frequency Integrated Circuits Symposium, RFIC 2009, pp. 207-210.

Cohen, et al., "A CMOS bidirectional 32-element phased-array transceiver at 60GHz with LTCC antenna", 2012 IEEE Radio Frequency Integrated Circuits Symposium (RFIC), pp. 439-442.

International Search Report and Written Opinion—PCT/US2013/033022—ISA/EPO—Sep. 16, 2013.

Jeon, et al., "A Triple-Mode Balanced Linear CMOS Power Amplifier Using a Switched-Quadrature Coupler", IEEE Journal of Solid-State Circuits, Sep. 2012, vol. 47, No. 9, pp. 2019-2032.

Kim, et al., "A Switchless Q-Band Bidirectional Transceiver in 0.12um SiGe BiCMOS Technology", IEEE Journal of Solid-State Circuits, Feb. 2012, vol. 47, No. 2, pp. 368-380.

Razavi, et al., "A UWB CMOS transceiver," IEEE Journal of Solid-State Circuits, Dec. 2005, vol. 40, No. 12, pp. 2555-2562.

\* cited by examiner

RECONFIGURABLE INPUT POWER DISTRIBUTION DOHERTY AMPLIFIER WITH IMPROVED EFFICIENCY

BACKGROUND

1. Field

The present application relates generally to the operation and design of wireless devices, and more particularly, to the operation and design of power amplifiers.

2. Background

There is an increasing demand to have wireless devices capable of low power operation to provide extended talk times. One key to achieving lower power consumption is associated with the performance of the device's power amplifier (PA). For example, highly linear and efficient power amplifiers can be used to maximize the standby and talk times for a handset. However, in conventional PA designs, efficiency is generally high only at high output levels. When lower output levels are needed, typically for complex modulation like OFDM, the efficiency drops substantially.

A Doherty power amplifier has been used to improve the average power efficiency. The Doherty power amplifier has a power splitter that splits the input power into a main amplifier and an auxiliary amplifier. However, during operation when the auxiliary amplifier is not turned on, the signal power directed to it is wasted thereby reducing efficiency. Therefore, what is needed is a way to optimize the input power distribution in a Doherty amplifier, thereby utilizing all the input power which will increase the total power efficiency.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
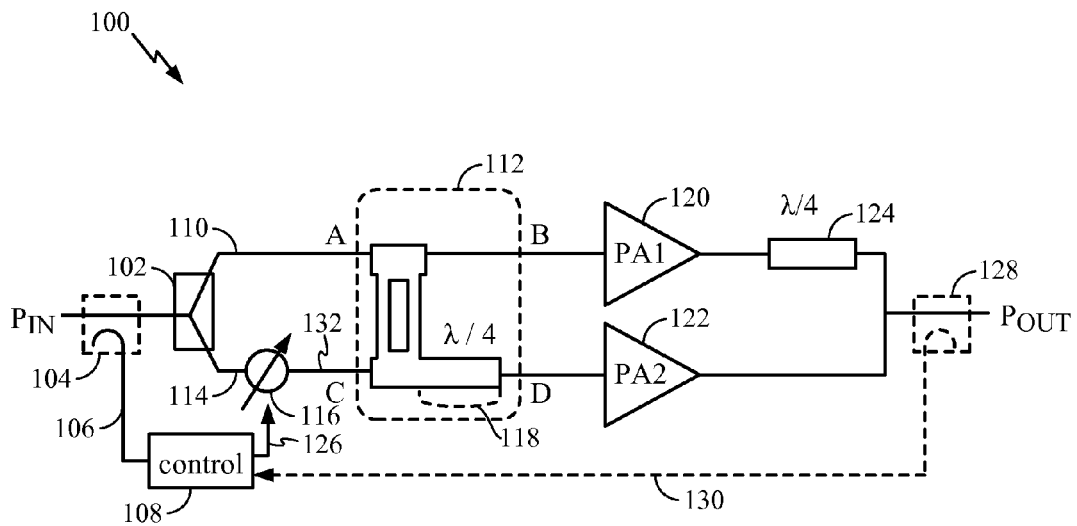
FIG. 1 illustrates an exemplary embodiment of an improved Doherty power amplifier for millimeter (MM) wave applications.

FIG. 1 illustrates an exemplary embodiment of an improved Doherty power amplifier 100 for millimeter (MM) wave applications. The amplifier 100 is suitable for use in a wireless handset or other portable device and also for use in a base station or any other wireless communication apparatus.

The amplifier 100 comprises a power splitter 102 that receives a MM wave input signal ($P_{IN}$). A power detector 104 detects power on the input and provides a detection signal 106 to a controller 108. A first output (split signal) 110 of the splitter 102 is input to the "A" input of a hybrid plus coupler 112. A second output (split signal) 114 of the splitter 102 is input to a phase shifter 116. The phase shifted output signal 132 of the phase shifter 116 is a phase shifted version of the second split signal 114 and is input to the "C" input of the hybrid plus coupler 112. Both outputs of the splitter 102 have power levels that are 3 dB less than the input signal ($P_{IN}$) power level.

In an exemplary embodiment, the hybrid plus coupler 112 comprises a ¼ wavelength extension 118. This extension is used to provide a 90 degree phase shift. The extension 118 can be constructed by distributed elements, like transmission lines, or using lumped elements, like LC filters. In another embodiment, the hybrid plus coupler 108 comprise a 180 degree ring coupler as discussed below.

The hybrid plus coupler 112 has a first output at terminal "B" coupled to a main power amplifier (PA1) 120 and a second output at terminal "D" coupled to an auxiliary power amplifier (PA2) 122. The output of the first power amplifier 120 is input to a (¼ wavelength phase shifter) 124 that is used to equalize the total phase shift from $P_{IN}$ to $P_{OUT}$ between the PA1 signal path and the PA2 signal path. The output of the phase shifter 124 and second power amplifier 122 are coupled together to produce the output power signal ($P_{OUT}$).

During operation, the hybrid plus coupler 112 generates first and second combinations of the phase shifted version signal 132 and the millimeter wave second signal 110. For example, the combinations of the input signals are provided at first and second output terminals (B and D), respectively. The first and second combinations set output power levels at the first and second output terminals, which in effect, distributes the input power on the hybrid coupler input terminals to its output terminals based on the phase shift introduced by the phase shifter 116.

The controller 108 outputs a phase control signal 126 to control the amount of phase shift applied by the phase shifter 116 based on the power detection signal 106 detected by the power detector 104. Thus, at low power, the controller 108 controls the phase shifter 116 to generate a phase shift such that the hybrid plus coupler 112 directs power to the main power amplifier 120 and away from the auxiliary power amplifier 122, thereby providing improved efficiency over conventional systems. In an alternative embodiment, a power detector 128 is coupled to detect the power level of the output signal ($P_{OUT}$) and provide a detected power signal 130 to the controller 108. The controller 108 operates to control the phase shift provided by the phase shifter 116 based on the detected power signal 130. The extension 118 assists in distributing the power based on the phase shift introduced by the phase shifter 116.

Accordingly, an improved Doherty amplifier is provided that comprises a hybrid plus coupler 112 to steer the input power distribution with the phase shifter 116 and therefore provide greater efficiency at low power.

Figure 2:
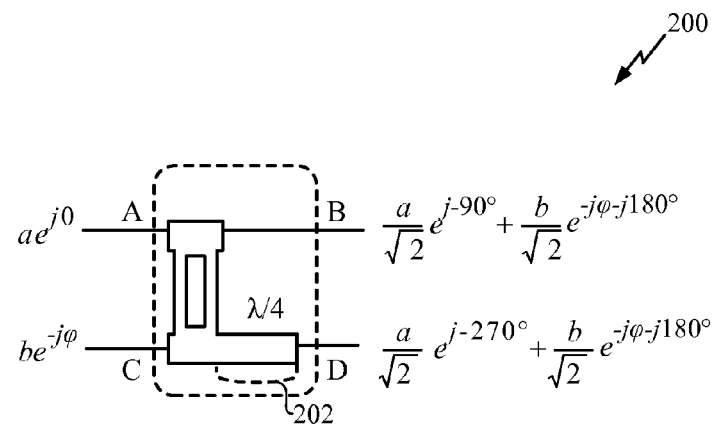
FIG. 2 shows an exemplary embodiment of a hybrid plus coupler.

FIG. 2 shows an exemplary embodiment of a hybrid plus coupler 200. For example, the hybrid plus coupler 200 is suitable for use as the hybrid plus coupler 108 shown in FIG. 1. The hybrid plus coupler 200 comprises input terminals A and C and output terminals B and D. The hybrid plus coupler 200 also comprises extension 202 which is used to provide a 90 degree phase shift. The extension 202 can be constructed by distributed elements, like transmission lines, or using lumped elements, like LC filters. A phase difference between the signals on the input terminals (A and C) results in the input power being redistributed on the output terminals (B and D). For example, assuming a and b are constant coefficients and the signals input to the A and C input terminals are:

$$A = ae^{j0} \quad (1)$$

$$C = be^{-j\phi} \quad (2)$$

the combination signals at the output terminals B and D can be expressed as:

$$B = \frac{a}{\sqrt{2}} e^{-j90°} + \frac{b}{\sqrt{2}} e^{-j\varphi - j180°} \quad (3)$$

$$D = \frac{a}{\sqrt{2}} e^{-j270°} + \frac{b}{\sqrt{2}} e^{-j\varphi - j180°} \quad (4)$$

Figure 3:
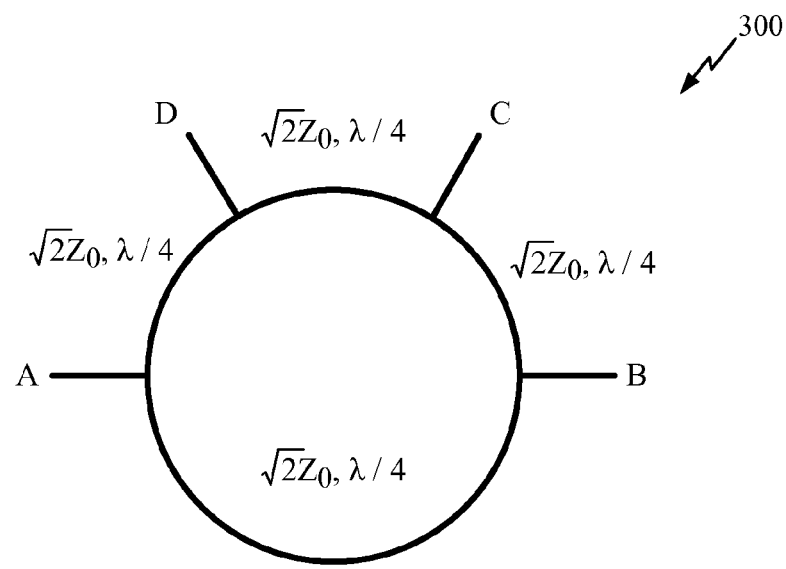
FIG. 3 shows an exemplary embodiment of a hybrid ring coupler.

Therefore, if (a=b), then the follow power distributions result based on the phase difference between the input signals.
If $\phi=90°$ then, B=0, D=$\sqrt{2}$ae$^{-j270°}$ to Aux amplifier
If $\phi=-90°$ then, D=0, B=$\sqrt{2}$ae$^{-j180°}$ to Main amplifier
If $\phi=0°$ then both amplifiers will be on with equal power FIG. 3 shows an exemplary embodiment of a hybrid ring coupler 300. For example, the hybrid ring coupler 300 is suitable for use as the hybrid plus coupler 108 shown in FIG. 1. The hybrid ring coupler 300 comprises inputs A and C and outputs B and D. A phase difference between the signals at the input terminals (A and C) results in power being redistributed on the output terminals (B and D). For example, assuming the signals input to the A and C terminals are:

$$A = ae^{j0} \quad (5)$$

$$C = be^{-j\phi} \quad (6)$$

the combination signals at the output terminals B and D can be expressed as:

$$B = \frac{a}{\sqrt{2}} e^{-j270°} + \frac{b}{\sqrt{2}} e^{-j\varphi - j90°} \quad (7)$$

$$D = \frac{a}{\sqrt{2}} e^{-j270°} + \frac{b}{\sqrt{2}} e^{-j\varphi - j90°} \quad (8)$$

Figure 4:
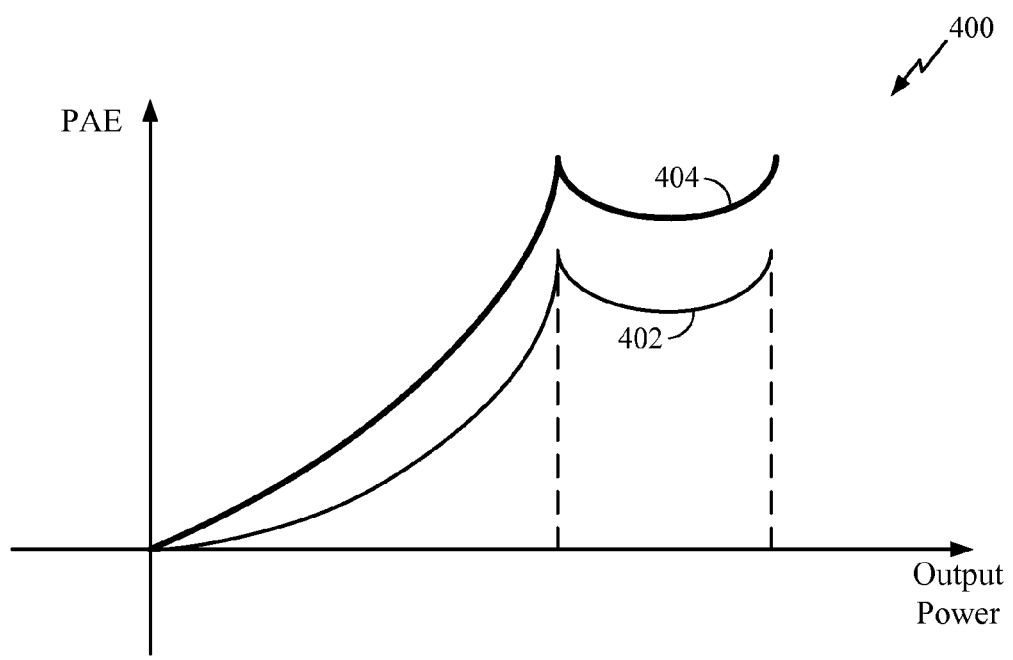
FIG. 4 shows an exemplary graph that illustrates the increase in efficiency provided by exemplary embodiments of the improved Doherty amplifier of FIG. 1.

Therefore, if (a=b), then the follow power distributions result based on the phase difference between the input signals.
If $\phi=0°$ then, B=0, D=$\sqrt{2}$ae$^{-j90°}$ to Aux amplifier
If $\phi=180°$ then, D=0, B=$\sqrt{2}$ae$^{-j270°}$ Main amplifier
If $\phi=90°$ then both amplifiers will be on with equal power FIG. 4 shows an exemplary graph 400 that illustrates the increase in efficiency provided by exemplary embodiments of the improved Doherty amplifier 100. For example, the graph 400 includes plot line 402 representing the efficiency of a typical Doherty amplifier. The plot line 404 represents the power amplifier efficiency (PAE) of an improved Doherty amplifier constructed in accordance with the disclosed embodiments where:

$$PAE = (P_{OUT} - P_{IN})/P_{DC}$$

Figure 5:
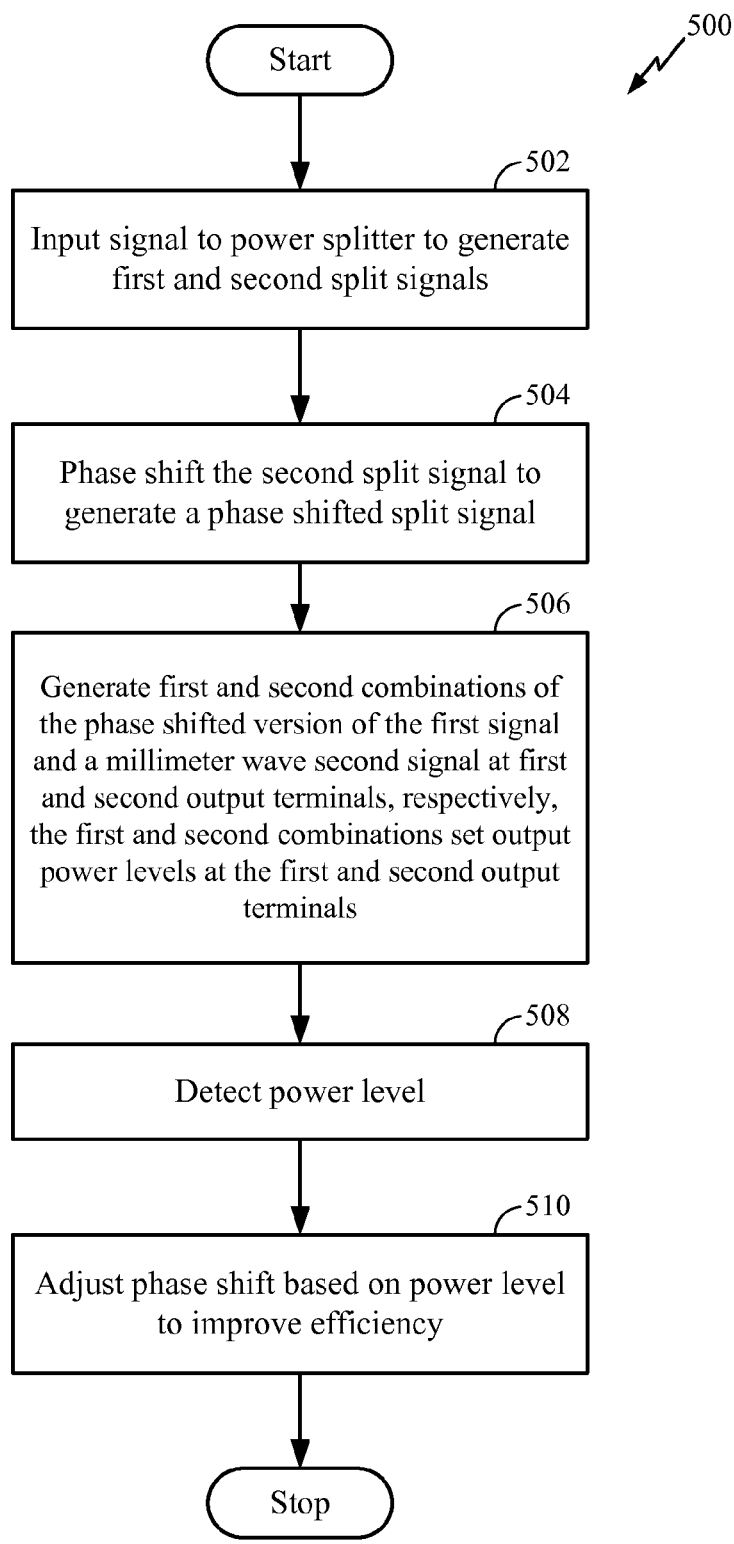
FIG. 5 shows an exemplary method for providing increased efficiency from a Doherty amplifier.

FIG. 5 shows an exemplary method 500 for providing an improved Doherty amplifier. For example, the method 500 is performed by the amplifier 100 shown in FIG. 1.

At block 502, a MM wave signal to be amplified is input to a power splitter to generate first and second split signals. For example, the signal is input to the power splitter 102 shown in FIG. 1 to generate the first split signal 110 and the second split signal 114.

At block 504, the second split signal is phase shifted to generate a phase shifted split signal. For example, the split signal 114 is input into the phase shifter 116 to generate the phase shifted signal 132.

At block 506, first and second combinations of the phase shifted version of the first signal and a millimeter wave second signal are generated at first and second output terminals, respectively. The first and second combinations set output power levels at the first and second output terminals. For example, the first split signal and the phase shifted split signal are input to the hybrid plus coupler 112. For example, the signal 110 and the signal 132 are input to the input terminals (A and C) of the hybrid plus coupler 112. The hybrid plus coupler 112 has extension 118 to provide a 90 degree phase shift as described above. The hybrid plus coupler operates to generate combinations of its input signals according to the equations shown above. Thus the hybrid plus coupler operates to adjust output power levels at its output terminals based on combinations of a phase shifted first MM wave signal and a second MM wave signal.

At block 508, a power level is detected. For example, the power detector 104 detects the power of the input signal and provides the power detection signal 106 to the controller 108. In another exemplary embodiment, the power detector 128 detects the power of the output signal (P$_{OUT}$) and provides the power detection signal 130 to the controller 108.

At block 510, a phase shift is adjusted based on the detected power to improve efficiency. For example, the controller 108 outputs the phase control signal 126 to control the phase shift introduced by the phase shifter 116 so that the power distribution provided by the hybrid plus coupler 112 provides improved efficiency over conventional systems.

Therefore the method 500 operates to provide an improved Doherty amplifier using the phase shifter 116 and hybrid plus coupler 112 to adjust the power distribution of the output to achieve improved efficiency. In other exemplary embodiments, the operations of the method 500 may be rearranged or modified to provide the functions described herein.

Figure 6:
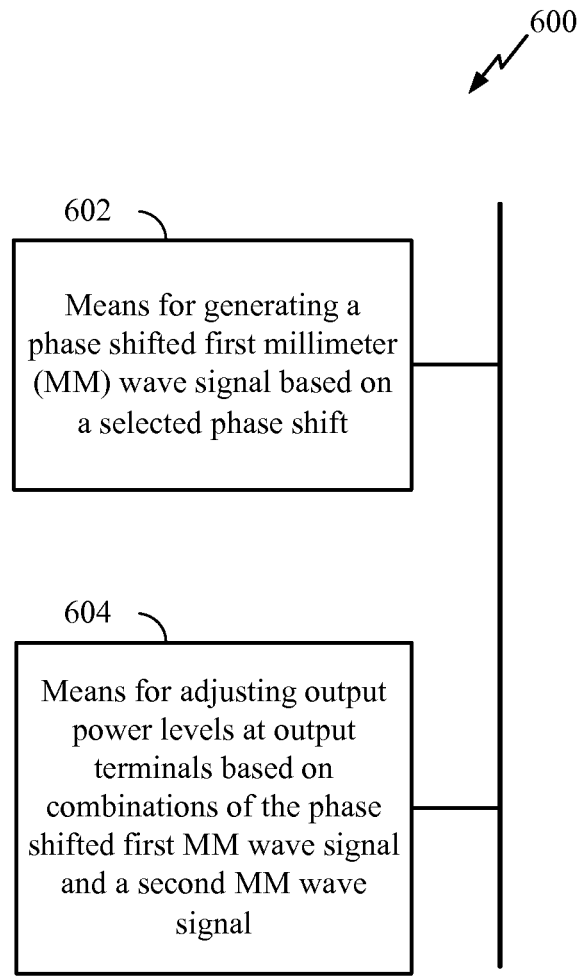
FIG. 6 shows an exemplary embodiment of a Doherty amplifier apparatus configured for increased efficiency.

FIG. 6 shows an exemplary embodiment of a Doherty amplifier apparatus 600 that provides improved efficiency. For example, the apparatus 600 is suitable for use as the amplifier 100 shown in FIG. 1. In an aspect, the apparatus 600 is implemented by one or more modules configured to provide the functions as described herein. For example, in an aspect, each module comprises hardware and/or hardware executing software.

The apparatus 600 comprises a first module comprising means (602) for generating a phase shifted first millimeter (MM) wave signal based on a selected phase shift, which in an aspect comprises phase shifter 116.

The apparatus 600 also comprises a second module comprising means (604) for adjusting output power levels at output terminals based on combinations of the phase shifted first MM wave signal and a second MM wave signal, which in an aspect comprises the hybrid plus coupler 112.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal In the alternative, the processor and the storage medium may reside as discrete components in a user terminal In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
    a phase shifter configured to generate a phase shifted first millimeter (MM) wave signal based on a selected phase shift; and
    a hybrid plus coupler comprising output terminals and a quarter wavelength extension at a selected output terminal, the hybrid plus coupler configured to adjust output power levels at the output terminals based on combinations of the phase shifted first MM wave signal and a second MM wave signal.

2. The apparatus of claim 1, the hybrid plus coupler configured to adjust output power at a first output terminal based on a first combination, and adjust output power at a second output terminal based on a second combination.

3. The apparatus of claim 1, the apparatus configured as a Doherty amplifier.

4. The apparatus of claim 1, further comprising a splitter configured to receive a MM wave input signal and to generate a first MM wave signal and the second MM wave signal at substantially equal power levels, the first MM wave signal is input to the phase shifter.

5. The apparatus of claim 1, the extension configured to provide a 90 degree phase shift that is used to generate the combinations.

6. The apparatus of claim 1, the hybrid plus coupler configured to generate a power distribution between a first output terminal (B) and a second output terminal (D) based on a phase difference (φ) between the second MM wave signal and the phase shifted first MM wave signal, the power distribution between the terminals B and D is determined from:

$$B = \frac{a}{\sqrt{2}} e^{-j90°} + \frac{b}{\sqrt{2}} e^{-j\varphi - j180°}$$

$$D = \frac{a}{\sqrt{2}} e^{-j270°} + \frac{b}{\sqrt{2}} e^{-j\varphi - j180°}.$$

7. The apparatus of claim 1, further comprising a controller configured to output a phase control signal that adjusts the selected phase shift.

8. The apparatus of claim 7, further comprising an input power detector configured to output an input power indicator that is used by the controller to generate the phase control signal.

9. The apparatus of claim 7, further comprising an output power detector configured to output an output power indicator that is used by the controller to generate the phase control signal.

10. The apparatus of claim 1, the apparatus configured to amplify a MM wave input signal in at least one of a wireless device and a base station.

11. A method comprising:
generating a phase shifted first millimeter (MM) wave signal based on a selected phase shift;
adjusting output power levels at output terminals based on combinations of the phase shifted first MM wave signal and a second MM wave signal; and
adjusting the selected phase shift based on a detected output power level.

12. The method of claim 11, comprising:
adjusting output power at a first output terminal based on a first combination; and
adjusting output power at a second output terminal based on a second combination.

13. The method of claim 11, further comprising splitting a MM wave input signal to generate a first MM wave signal and the second MM wave signal at substantially equal power levels.

14. The method of claim 11, further comprising generating a power distribution between a first output terminal (B) and a second output terminal (D) based on a phase difference (φ) between the second MM wave signal and the phase shifted first MM wave signal, the power distribution between the terminals B and D is determined from:

$$B = \frac{a}{\sqrt{2}} e^{-j90°} + \frac{b}{\sqrt{2}} e^{-j\varphi - j180°}$$

$$D = \frac{a}{\sqrt{2}} e^{-j270°} + \frac{b}{\sqrt{2}} e^{-j\varphi - j180°}.$$

15. The method of claim 11, further comprising adjusting the selected phase shift based on a detected input power level.

16. An apparatus comprising:
means for generating a phase shifted first millimeter (MM) wave signal based on a selected phase shift;
means for adjusting output power levels at output terminals based on combinations of the phase shifted first MM wave signal and a second MM wave signal; and
means for adjusting the selected phase shift based on at least one of a detected input power level and a detected output power level.

17. The apparatus of claim 16, further comprising:
means for adjusting output power at a first output terminal based on a first combination; and
means for adjusting output power at a second output terminal based on a second combination.

18. The apparatus of claim 16, further comprising means for generating a power distribution between a first output terminal (B) and a second output terminal (D) based on a phase difference (φ) between the second MM wave signal and the phase shifted first MM wave signal, the power distribution between the terminals B and D is determined from:

$$B = \frac{a}{\sqrt{2}} e^{-j90°} + \frac{b}{\sqrt{2}} e^{-j\varphi - j180°}$$

$$D = \frac{a}{\sqrt{2}} e^{-j270°} + \frac{b}{\sqrt{2}} e^{-j\varphi - j180°}.$$

* * * * *